Figure 1:
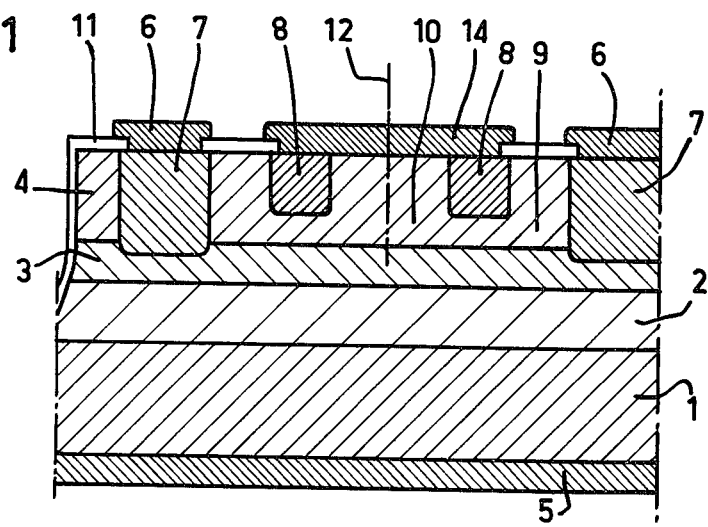

United States Patent [19]

Roger

[11] 4,151,541
[45] Apr. 24, 1979

[54] POWER TRANSISTOR
[75] Inventor: Bernard Roger, Carpiquet, France
[73] Assignee: U.S. Philips Corporation, New York, N.Y.
[21] Appl. No.: 859,601
[22] Filed: Dec. 12, 1977
[30] Foreign Application Priority Data
Dec. 20, 1976 [FR] France .................. 76 38304
[51] Int. Cl.² .......................................... H01L 29/721
[52] U.S. Cl. ....................................... 357/34; 357/36; 357/89; 357/90
[58] Field of Search ........................ 357/34, 36, 89, 90
[56] References Cited
U.S. PATENT DOCUMENTS
4,035,824   7/1977   Suzuki ..................................... 357/34
4,080,619   3/1978   Suzuki ..................................... 357/34

Primary Examiner—Edward J. Wojciechowicz
Attorney, Agent, or Firm—Briody, Thomas A.; Steven R. Biren

[57] ABSTRACT

A bipolar transistor includes an emitter zone having two regions of different doping levels. The more highly doped region is a surface-adjoining region located in the lower-doped region, extending only partially through the lower-doped region and laterally surrounding a central portion thereof. The transistor also includes a surface-adjoining base contact zone which surrounds the emitter zone and is laterally spaced apart from the more highly-doped region of the emitter zone. Additionally, a surface-adjoining conductive electrode is provided for contacting both the more highly-doped emitter region and the central portion of the less-highly doped region of the emitter zone. This configuration results in a transistor having improved reverse breakdown characteristics.

5 Claims, 2 Drawing Figures

POWER TRANSISTOR

The invention relates to a transistor having a semiconductor body comprising a first semiconductor layer of a first conductivity type which forms at least a part of the collector zone of the transistor, a second layer of the second conductivity type adjoining same and constituting the base zone, and an emitter zone which is formed by a part of a third semiconductor layer of the first conductivity type which adjoins the second layer, and a more highly doped surface region of the first conductivity type situated therein, the said part of the third layer being bounded by a highly doped base contact zone which connects the second layer to the surface, the said surface region being situated at a distance from the base contact zone.

Transistors are known having a low-doped emitter zone (sometimes termed LEC transistors, derived from "Low Emitter Concentration"), in which the emitter zone is formed by two regions, namely a first low-doped region adjoining the base zone and a highly doped surface region adjoining the emitter electrode and situated in the first first region. So this structure shows two emitter regions which form, for example, an N+/N junction in the case of an npn transistor, which junction results in a good emitter efficiency and an advantageous current gain notwithstanding the low doping of the emitter zone at the base-emitter junction.

This type of transistor was described, for example, in French Patent Specification No. 2,266,307. However, these transistors remain sensitive to what is called secondary breakdown in the reverse direction, sometimes termed thermal avalanche effect, which occurs in particular when a power transistor is used to perform a switching function with an inductive load: the emitter-base junction may be polarized in the reverse direction, while a very strong collector current flows and the voltage between the emitter and collector can reach the breakdown voltage $BV_{CEO}$ between collector and emitter with floating base; in this case secondary breakdown in the reverse direction usually results in the destruction of the transistor due to the localized excessive heating which is to be ascribed to the current concentration in the center of the emitter zone.

In this manner the use of the transistor at high voltage is limited with respect to power. In order to improve the secondary breakdown behavior of such a transistor in the reverse direction, a temperature control of the crystal is necessary and for that purpose the gain of the transistor and the current distribution should be controlled.

It is known that when transistors operate in these conditions, a voltage drop occurs in the base zone along the emitter-base junction between on the one hand the base zone part situated below the highly doped central part of the emitter zone nearest to the emitter contact and on the other hand the peripheral part which adjoins the base contact or a highly doped base contact zone. The said voltage drop in the base zone results in a current concentration in the central part of the emitter zone, the peripheral part of the emitter zone being polarized in the reverse direction; this is what is called the focalization effect.

It is to be noted that the above used expressions "central part" and "peripheral part" do not define the shape and the dimensions of the said region and that said regions may comprise, for example, several islands or show a comb-like configuration and may form interdigitated configurations with other regions. As regards this latter it is assumed that the said central part of the emitter zone corresponds to the axis of the digits of the "comb" which forms the emitter zone, while the peripheral part corresponds to the part situated nearest to base contacts or the base contact zone.

In the case of the above-described transistors, a defocalization effect may occur with respect to secondary breakdown in the forward direction with strong currents. The current injected by the peripheral part of the emitter zone is then chanelled to the base contact zone and passes a low-doped emitter region. This may give rise to a heat distribution which even at strong currents permits of using the transistor at full power. It is the object of the invention to obtain a similar result with respect to secondary breakdown in the reverse direction. In fact it is the object of the invention to improve the secondary breakdown behavior in the reverse direction of transistors belonging to the above-described type, the emitter zone of which comprises two regions of which one region is low-doped and which both show a multi-layer structure. The invention aims at extending the field of application of said transistors to switching functions in the presence of an inductive load without the occurrence of second breakdown.

For that purpose, the invention aims at controlling the temperature of the crystal by causing a defocalization of the current due to a new structure of the emitter zone.

According to the invention, a transistor of the kind described in the preamble is characterized in that the surface region of the first conductivity type surrounds a central part of the third semiconductor layer.

When the transistor operates in circumstances which enable secondary breakdown in the reverse direction, which is the case when the emitter-base junction is polarized in the reverse direction or is very weakly doped in the forward direction, a current flows substantially to the base zone starting from the highly doped surface region of the emitter zone. Taking into account on the one hand the geometry of the said region in the transistor according to the invention and on the other hand the current in the reverse direction which flows in the base zone and which tends to concentrate the current in the emitter zone in the central part thereof, the current starting from the emitter surface region flows through the low-doped third layer over a certain distance which is comparatively large; in this manner said current experiences a comparatively large resistance which tends to increase with temperature. When in a given point a localized heating occurs, the rise in temperature causes an increase of the resistance in said point and hence an increase of the resistance which opposes the current passage in the said point. In this manner the temperature is controlled and the danger of a thermal avalanche is eliminated.

It is to be noted that the expression "highly doped" is used in general for regions the doping concentration of which is higher than $10^{17}$ atoms/cm$^3$ and preferably is higher than $10^{18}$ atoms/cm$^3$, while the expression "low-doped" is used for an impurity concentration lower than $10^{17}$ atoms/cm$^3$ and preferably lower than $10^{16}$ atoms/cm$^3$. The sign "+" is added to the N or P conductivity type to denote a high doping.

The transistor usually has a collector zone which is formed by an N+ conductive silicon substrate covered with an N-conductive epitaxial layer, a base zone which is formed in a P-conductive low-doped epitaxial layer which in addition comprises at least a highly doped diffused contact zone, and an emitter zone which is formed in an N-conductive low-doped epitaxial layer portion which is bounded by the base contact zone and which, at a certain distance from said contact zone and a certain distance from the axis of the said layer portion, comprises an N+-conductive highly doped strip-shaped region, the base contact zone and the said highly doped region being diffused from the surface of the epitaxial emitter layer via suitable mask apertures. In this structure the low-doped region of the emitter zone has all qualities which are to be ascribed to the epitaxial nature of the material, namely a very low crystal defect concentration and a good homogeneity of the electrical properties. This is also the case for the epitaxial part of the base zone.

According to a preferred embodiment of the transistor according to the invention, the distance "$d_1$" between the highly doped surface region of the emitter zone and the base contact zone is substantially constant and is such that secondary breakdown cannot occur at a voltage which is lower than the breakdown voltage $BV_{CEO}$ of the transistor at the power which should be dissipated by same. It is advantageous when the width of the said low-doped central part of the third layer, that is the distance between the two parts of the strip which is formed by the highly doped surface region of the emitter zone on either side of an axis of the said region, in this case termed distance "$d_2$", is approximately 2d and is sufficiently large to obtain the low-doped layer portion which is traversed by the current which is injected by the highly doped region of the emitter zone and to cause the increase of the said resistance with temperature to result in a reduction of the base current and of the emitter current so that the thermal avalanche effect is eliminated. According to a particular embodiment the distance "$d_1$" is at least 20 microns and preferably exceeds 40 microns, while the distance $d_2$ is 50 to 200 microns, the thickness of the low-doped emitter layer being from 5 to 10 microns.

It is advantageous when the emitter zone and the base zone of the transistor show an interdigitated structure, the emitter zone and the base zone each having the shape of a comb the digits of which have a width which, measured between two walls of the base contact zone, is at least 200 microns and is, for example, equal to 300 microns.

The invention may be applied in particular to power transistors which are to be used at comparatively high voltages for switching an inductive load. The invention relates more in particular to epitaxial multilayer transistors, the emitter zone of which has two regions whose dopings differ considerably from each other, and in particular to such transistors having a mesa structure.

Figure 2:
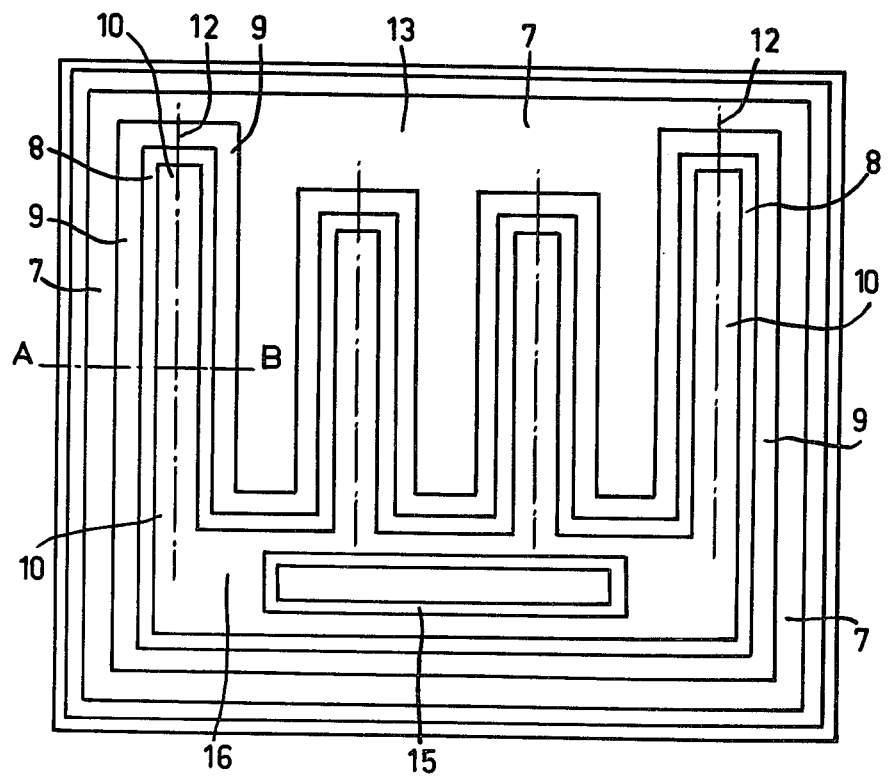

The invention will now be described in greater detail with reference to the drawing, in which:

FIG. 1 is a partly diagrammatic sectional view taken on the line AB in FIG. 2 of a transistor according to the invention, and FIG. 2 is a plan view of the transistor shown in FIG. 1 prior to the formation of the contact electrodes for the base zone and the emitter zone.

The transistor shown in FIGS. 1 and 2 comprises an N+-conductive silicon substrate covered by a first N-conductive epitaxial layer 2 the thickness of which is 20 microns and the resistivity of which is 10. Ohm.cm. The substrate 1 and the layer 2 form the collector zone of the transistor which also has a metal electrode 5 which is provided on the lower surface of the substrate and serves to contact the collector zone.

The base zone of the transistor is formed by a second P-conductive epitaxial layer 3 the thickness of which is 15 microns and the resistivity of which is 7 Ohm.cm. A third N-conductive epitaxial surface layer 4 is provided on the layer 3. The resistivity of said layer 4 is 6 Ohm.cm, while the thickness thereof is 8 microns. The base zone 3 is connected to an electrode 6 via a base contact zone 7 which extends through the layer 4 and is strongly P+-conductive, the sheet resistance of the zone 7 being at most 10 Ohms per square. The zone 7 is comb-like and serves to isolate a part 9 of the layer 4 which forms the emitter zone, is also comb-like and forms an interdigitated configuration with the zone 7.

An N+-conductive highly doped surface region 8 is obtained via diffusion in the layer 4 over a depth of 3 microns and according to a strip-shaped region the width of which is 40 microns and which is situated at a distance of 50 microns from the wall of the zone 7 and at a distance of 30 microns from the axis 12 of the part of the layer 4 which is present between the walls of the zone 7 and which forms one of the "digits" of the emitter zone. The resistivity of the said region 8 is $10^{-3}$ Ohm cm. An electrode 14 serves to contact the surface of the emitter zone. In this manner the narrow and highly doped part 8 injects substantially the full emitter current and when the transistor operates with a polarization in the forward direction of the emitter-base junction, the lateral current in the base zone endeavors to reduce the polarization in the center of the emitter zone and to concentrate the emitter current at the periphery of the emitter zone. Said current flows through the part 9 of the layer 4 and said part 9 is low-doped and has a high resistance which results in a current distribution which in turn ensures the temperature control at high power.

When the emitter-base junction is polarized in the reverse direction or is very weakly polarized in the forward direction, and the transistor operates in circumstances which may give rise to the occurrence of secondary breakdown in the reverse direction, the emitter current flows through the central part 10 of the layer 4; the said part 10 is low-doped and constitutes a comparatively high resistance which increases with the temperature, which produces a control of the temperature and eliminates second breakdown.

The transistor shown comprises four emitter zone digits but it is, of course, possible to realize other numbers of emitter zone digits.

A surface 13 is reserved on the zone 7 to connect a base connection to the electrode 6. On a widened part 16 which is reserved on the part of the layer 4 which forms the emitter zone, a highly doped strip 15 is also provided analogous to the strip 8 so as to improve in this manner the quality of the contact at the area of the emitter zone connection.

According to another embodiment of a transistor according to the invention, designed to operate at high voltage and with a structure which is the same as that of the transistor described above with reference to FIGS. 1 and 2, starting material is an N+-conductive silicon substrate which is covered by a first N-conductive epitaxial layer the thickness of which is 60 microns and the resistivity of which is 30 Ohm cm, said substrate and the said layer constituting the collector zone of the transistor.

The base zone of the transistor is formed by a second P-conductive epitaxial layer the thickness of which is 10 microns and the resistivity of which is 5 Ohm cm. The said second epitaxial layer is connected to the surface of the device by a p+-conductive diffused surface contact zone the resistivity of which is lower than 10 Ohm per square.

The emitter zone of the transistor is formed by a region which is bounded by said P+-conductive zone and which forms part of an N-conductive third epitaxial layer having a thickness of 8 microns and a resistivity of 5 Ohm cm, while in the said region an N+-conductive highly doped surface region is diffused with a thickness of 3 microns and a sheet resistance of approximately 2 Ohm per square. The said emitter surface region has the shape of a strip in a width of 80 microns and said strip is situated at a distance of 20 microns from the base contact zone and at a distance of 60 microns from the axis of each "digit" of the emitter zone, while said emitter zone and the base zone show an interdigitated configuration the number of digits of which is such that the periphery of the emitter zone is approximately 25 mm. Between emitter and collector with floating base, such a transistor has a breakdown voltage $BV_{CEO}$ exceeding 400 Volts, while between collector and base with short-circuited emitter junction the transistor has a breakdown voltage exceeding 700 Volts, the said breakdown voltages being reached without the occurrence of secondary breakdown. When the said transistor is used for a switching function on an inductive load, the said transistor shows a dissipation in the reverse direction which exceeds 1 Joule for a crystal having a surface area of 3 mm×3 mm.

The two transistors which were described by way of example can be obtained by means of conventional methods.

It is to be noted that the invention is not restricted to the examples described. In particular, the conductivity types may all be replaced by their opposite types. Other semiconductor materials and insulation layers may also be used.

What is claimed is:

1. A bipolar transistor which comprises:

a first semiconductor layer of a first type conductivity which forms at least a part of the collector zone of said transistor;

a second semiconductor layer of a second type conductivity opposite to that of the first which adjoins said first layer and forms the base zone of said transistor;

a third surface-adjoining semiconductor layer of said first conductivity type which adjoins said second layer and forms a part of the emitter zone of said transistor;

a surface-adjoining region of said first type conductivity in said third layer and having a higher impurity doping level than that of said third layer, said surface-adjoining region extending only partially through said third layer and laterally surrounding a central portion thereof;

a surface-adjoining base contact zone of said second type conductivity which surrounds said third layer and connects said base zone to the surface of said transistor, said surface-adjoining region being laterally spaced apart from said base contact zone; and a surface-adjoining conductive electrode for contacting said emitter zone, said electrode being connected to both the surface-adjoining region and the central portion of said third layer.

2. A bipolar transistor as in claim 1, wherein the lateral spacing between said surface-adjoining region and said surface-adjoining base contact zone is everywhere substantially constant.

3. A bipolar transistor as in claim 1, wherein the width of the central portion of said third layer is at least about twice the lateral spacing distance between the surface-adjoining region and the surface-adjoining base contact zone.

4. A bipolar transistor as in claim 3, wherein said lateral spacing distance is at least about 20 microns and the width of the central portion of said third layer is at least about 50 microns and at most about 200 microns.

5. A bipolar transistor as in claim 1, wherein both the emitter zone and the surface-adjoining region are interdigitated with the base contact zone.

* * * * *